United States Patent
Lowrey et al.

(10) Patent No.: US 6,312,988 B1
(45) Date of Patent: Nov. 6, 2001

(54) METHODS OF FORMING CAPACITORS, METHODS OF FORMING CAPACITOR-OVER-BIT LINE MEMORY CIRCUITRY, AND RELATED INTEGRATED CIRCUITRY CONSTRUCTIONS

(75) Inventors: Tyler A. Lowrey, Sandpoint; Luan C. Tran, Meridian, both of ID (US); Alan R. Reinberg, Westport, CT (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/389,532

(22) Filed: Sep. 2, 1999

(51) Int. Cl.[7] .................................................. H01L 21/8242
(52) U.S. Cl. ........................ 438/255; 438/250; 438/251; 438/252; 438/253; 438/254; 438/393; 438/394; 438/395; 438/396; 438/397; 438/398; 438/399
(58) Field of Search ................................... 438/250–256, 438/393–399

(56) References Cited

U.S. PATENT DOCUMENTS

| | | | |
|---|---|---|---|
| 5,759,893 | * | 6/1998 | Wu ........................................ 438/254 |
| 5,770,500 | | 6/1998 | Batra et al. . |

(List continued on next page.)

FOREIGN PATENT DOCUMENTS

| | | |
|---|---|---|
| 195 43 539 C 1 | 10/1997 | (DE) . |
| 199 07 062 A 1 | 11/1999 | (DE) . |
| 0 901 159 A2 | 10/1999 | (EP) . |
| WO 96/28844 | 9/1996 | (WO) . |

OTHER PUBLICATIONS

M. Asakura et al.; "A 34ns 256Mb DRAM with Boosted Sense–Ground Scheme"; IEEE International Solid–State Circuits Conference, 1994; 2 pages.

(List continued on next page.)

Primary Examiner—Richard Booth
Assistant Examiner—Jennifer M. Kennedy
(74) Attorney, Agent, or Firm—Wells, St. John, Roberts, Gregory & Matkin P.S.

(57) ABSTRACT

Methods of forming capacitors, methods of forming capacitor-over-bit line memory circuitry, and related integrated circuitry constructions are described. In one embodiment, a capacitor storage node is formed having an uppermost surface and an overlying insulative material over the uppermost surface. Subsequently, a capacitor dielectric functioning region is formed discrete from the overlying insulative material operably proximate at least a portion of the capacitor storage node. A cell electrode layer is formed over the capacitor dielectric functioning region and the overlying insulative material. In another embodiment, a capacitor storage node is formed having an uppermost surface and a side surface joined therewith. A protective cap is formed over the uppe-most surface and a capacitor dielectric layer is formed over the side surface and protective cap. A cell electrode layer is formed over the side surface of the capacitor storage node. In yet another embodiment, a plurality of capacitor storage nodes are formed arranged in columns. A common cell electrode layer is formed over the plurality of capacitor storage nodes. Cell electrode layer material is removed from between the columns and isolates individual cell electrodes over individual respective capacitor storage nodes. After the removing of the cell electrode layer material, conductive material is formed over portions of remaining cell electrode material thereby placing some of the individual cell electrodes into electrical communication with one another.

45 Claims, 11 Drawing Sheets

U.S. PATENT DOCUMENTS

| | | | | |
|---|---|---|---|---|
| 5,953,608 | * | 9/1999 | Hirota | 438/253 |
| 6,004,859 | * | 12/1999 | Lin | 438/398 |
| 6,037,234 | * | 3/2000 | Hong et al. | 438/396 |
| 6,103,568 | * | 8/2000 | Fujiwara | 438/253 |
| 6,159,818 | * | 12/2000 | Durcan et al. | 438/387 |
| 6,184,081 | * | 2/2001 | Jeng et al. | 438/253 |

OTHER PUBLICATIONS

T. Inaba et al.; "A 250mV Bit–Line Swing Scheme for a IV 4 Gb DRAM"; 1995 Symposium on VLSI Circuits Digest of Technical Papers; pp. 99–100.

Takeshi Hamamoto et al.; "Cell–Plate–Line and Bit–Line Complementarily Sensed (CBCS) Architecture for Ultra Low–Power Non–Destructive DRAMs"; 1995 Symposium on VLSI Circuits Digest of Technical Papers; pp. 79–80.

Mikio Asakura et al.; "Cell–Plate Line Connecting Complementary Bitline ($C^3$) Architecture for Battery Operating DRAMS"; LSI Research and Development Laboratory; undated; pp. 59–60.

Mikio Asakura et al.; "Cell–Plate Line Connecting Complementary Bit–Line ($C^3$) Architecture for Battery–Operating DRAMs";; IEEE Journal of Solid–State Circuits, vol. 27, No. 4, Apr. 1992; pp. 597–602.

Satoshi Shinozaki; "DRAMS in the 21st Century"; 1996 IEDM Short Course; 5 pages.

Nicky Chau–Chun Lu et al.; "Hal–$V_{DD}$ Bit–Line Sensing Scheme in CMOS Dram's"; IEEE Solid–State Circuits, vol. SC–19, No. 4, Aug. 1994; pp. 451–454.

* cited by examiner

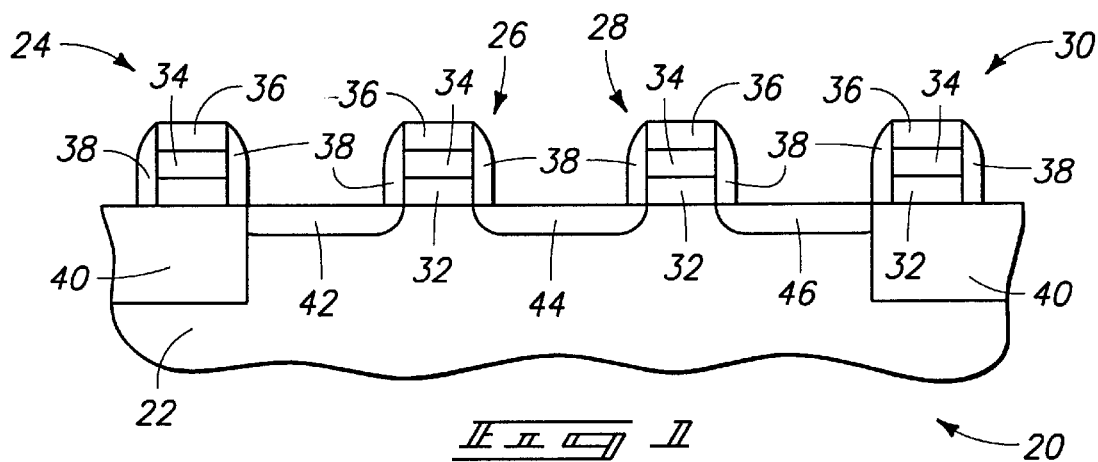
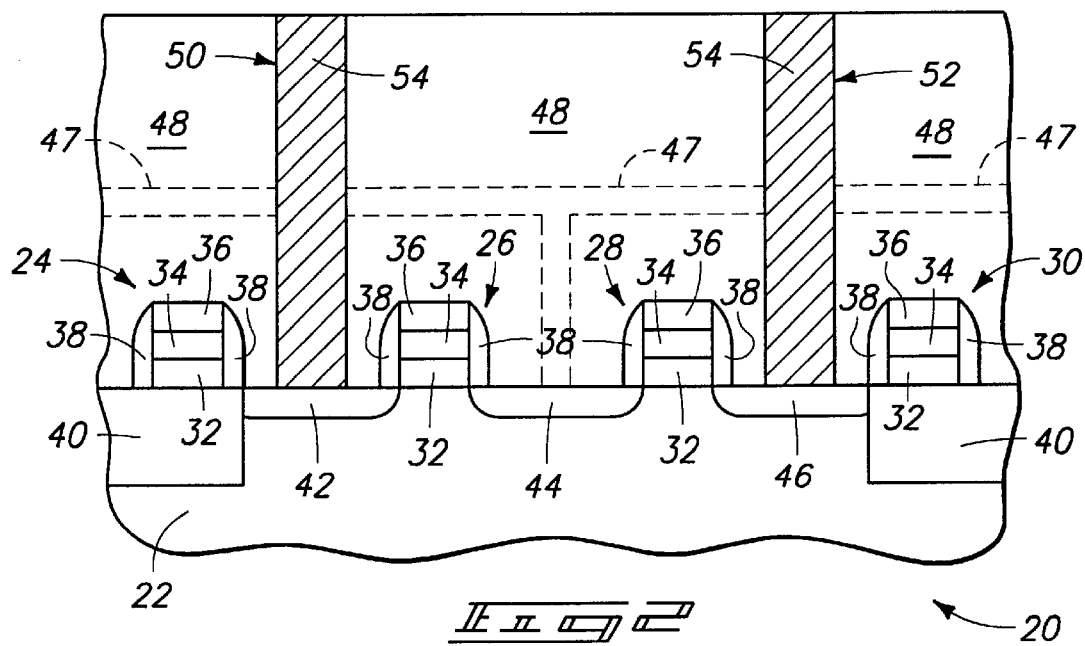

$\boxed{\text{F I G. 4}}$

METHODS OF FORMING CAPACITORS, METHODS OF FORMING CAPACITOR-OVER-BIT LINE MEMORY CIRCUITRY, AND RELATED INTEGRATED CIRCUITRY CONSTRUCTIONS

TECHNICAL FIELD

This invention relates to methods of forming capacitors, to methods of forming capacitor-over-bit line memory circuitry, and to related integrated circuitry constructions.

BACKGROUND OF THE INVENTION

As integrated circuitry continues to shrink in size, efforts are ongoing to find novel methods of forming integrated circuitry structures and related integrated circuitry which improve upon those methods currently utilized and the resultant structures formed thereby.

One type of integrated circuitry is memory circuitry. Such circuitry has been and continues to be the focus of intense efforts to reduce the size of the circuitry, increase the speed with which such circuitry operates, and maintain or increase the ability of such circuitry to perform its memory function.

Accordingly, this invention arose out of concerns associated with improving the methods by which integrated circuitry, and in particular, integrated memory circuitry is formed. This invention also arose out of concerns associated with providing improved integrated circuitry constructions.

SUMMARY OF THE INVENTION

Methods of forming capacitors, methods of forming capacitor-over-bit line memory circuitry, and related integrated circuitry constructions are described. In one embodiment, a capacitor storage node is formed having an uppermost surface and an overlying insulative material over the uppermost surface. Subsequently, a capacitor dielectric functioning region is formed discrete from the overlying insulative material operably proximate at least a portion of the capacitor storage node. A cell electrode layer is formed over the capacitor dielectric functioning region and the overlying insulative material. In another embodiment, a capacitor storage node is formed having an uppermost surface and a side surface joined therewith. A protective cap is formed over the uppermost surface and a capacitor dielectric layer is formed over the side surface and protective cap. A cell electrode layer is formed over the side surface of the capacitor storage node. In yet another embodiment, a plurality of capacitor storage nodes are formed arranged in columns. A common cell electrode layer is formed over the plurality of capacitor storage nodes. Cell electrode layer material is removed from between the columns and isolates individual cell electrodes over individual respective capacitor storage nodes. After the removing of the cell electrode layer material, conductive material is formed over portions of remaining cell electrode material thereby placing some of the individual cell electrodes into electrical communication with one another.

BRIEF DESCRIPTION OF THE DRAWINGS

Preferred embodiments of the invention are described below with reference to the following accompanying drawings.

FIG. 1 is a diagrammatic side sectional view of a semiconductor wafer fragment in process in accordance with one embodiment of the present invention.

FIG. 2 is a view of the FIG. 1 wafer fragment at a processing step which is subsequent to that which is shown in FIG. 1.

DETAILED DESCRIPTION OF THE PREFERRED EMBODIMENTS

Figure 3:
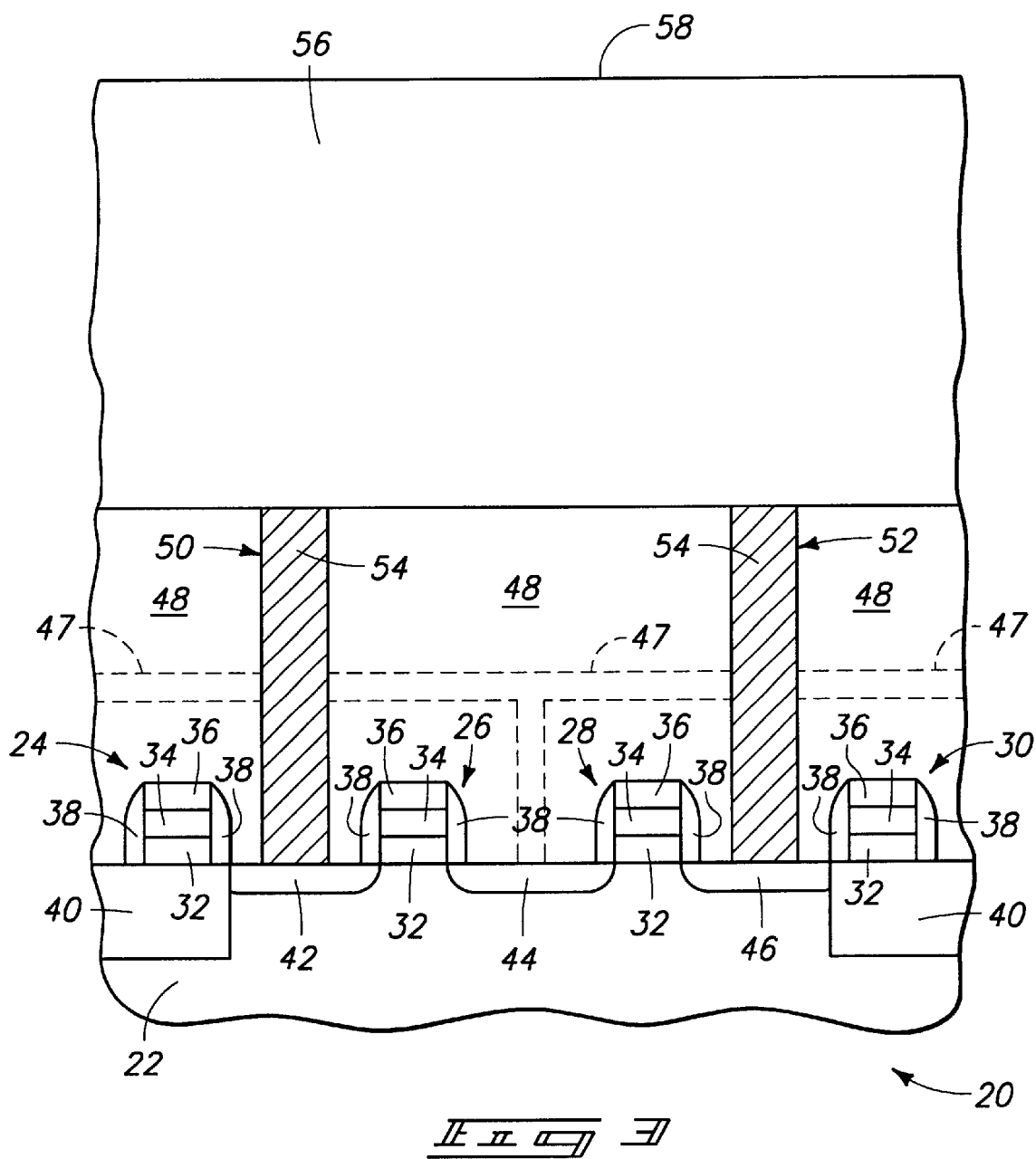
FIG. 3 is a view of the FIG. 1 wafer fragment at a processing step which is subsequent to that which is shown in FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 20 and comprises semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive lines 24, 26, 28, and 30 are formed over substrate 22 and include a gate oxide layer (not specifically shown), a conductive polysilicon layer 32, a silicide layer 34, an insulative cap 36, and sidewall spacers 38. Other conductive line constructions can, of course, be used. Shallow isolation trenches 40 are provided and are backfilled with dielectric material and are planarized. Isolation regions 40 can also be provided through other techniques such as field oxide isolation techniques. Diffusion regions 42, 44, and 46 are formed within substrate 22 intermediate respective conductive lines. The diffusion regions typically comprise regions of the substrate which are implanted with suitable impurities.

Referring to FIG. 2, a buried digit line 47 is formed and is encapsulated in an insulative layer such as borophosphosilicate glass (BPSG) 48 that is formed over substrate 22. Openings 50, 52 are formed in the insulative layer 48. The openings are formed over and join with respective diffusion regions 42, 46. Conductive material 54, e.g. conductively doped polysilicon, is formed over the substrate and within opening 50, 52. The buried digit line 47 is shown as a dashed line to emphasize that the buried digit line does not connect to (e.g., is behind, or is below the plane of FIG. 2) the conductive material 54 formed in the openings 50 and 52. Conductive material 54 can be subsequently planarized for isolation purposes. Conductive material 54 establishes electrical communication with the respective diffusion regions over which it is formed and will provide electrical communication between capacitor storage nodes which are to be formed as described below.

Referring to FIG. 3, a layer of material 56 is formed over substrate 22 and has a generally planar outer surface 58. For purposes of the ongoing discussion, layer 56 comprises a first insulative layer of material. An exemplary material is BPSG.

Figure 4:
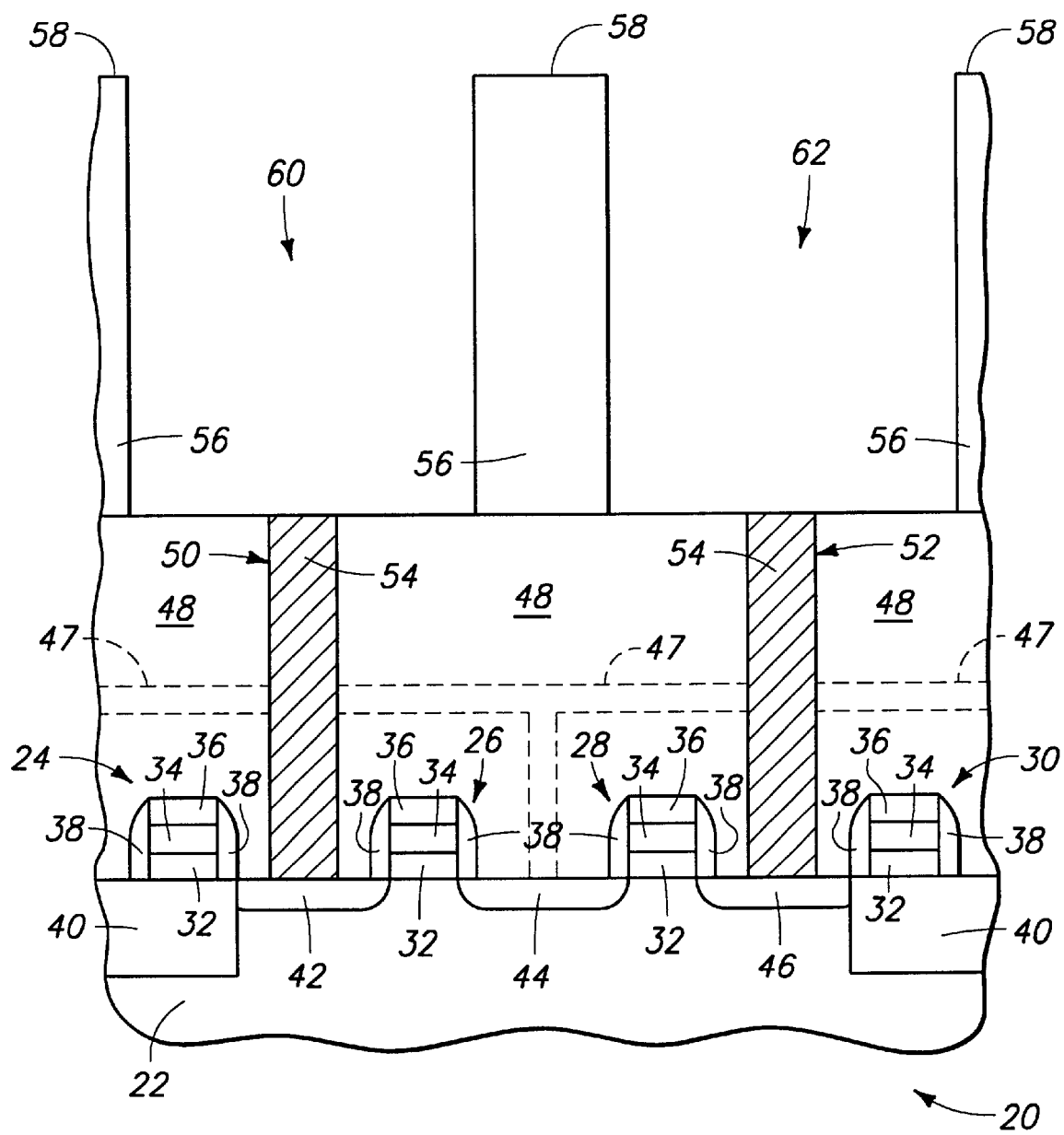
FIG. 4 is a view of the FIG. 1 wafer fragment at a processing step which is subsequent to that which is shown in FIG. 3.

Referring to FIG. 4, a plurality of openings are formed over or within layer 56, with exemplary openings being shown at 60, 62. In the illustrated and preferred embodiment, opening 60, 62 are formed to expose uppermost portions of conductive material 54.

Figure 5:
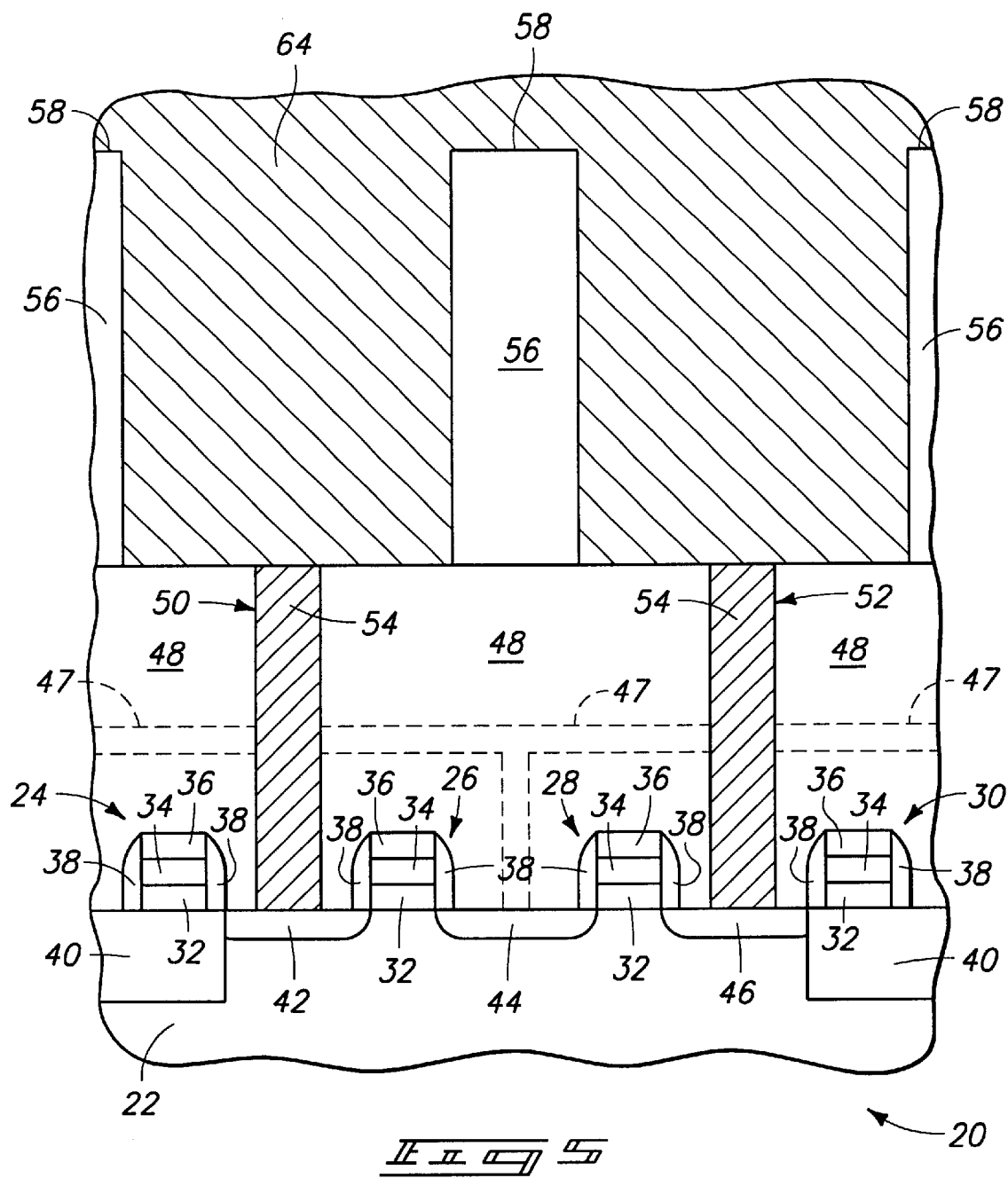
FIG. 5 is a view of the FIG. 1 wafer fragment at a processing step which is subsequent to that which is shown in FIG. 4.

Referring to FIG. 5, conductive material 64 is formed over substrate 22 and received within openings 60, 62. In the illustrated example, conductive material 64 is formed sufficiently to overfill the openings. It is possible, however, to only partially fill or underfill the openings for purposes which will become apparent below.

Figure 6:
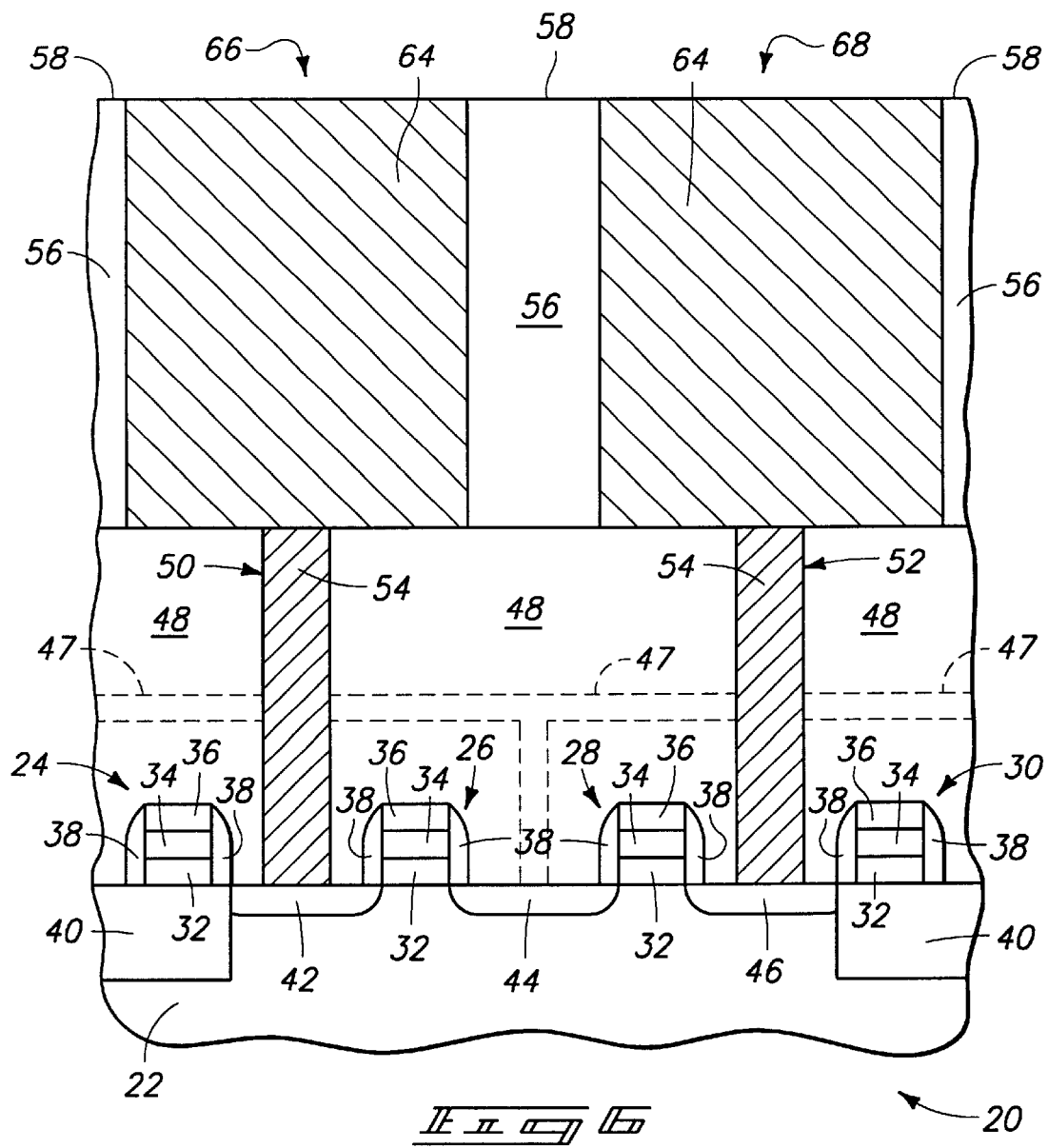
FIG. 6 is a view of the FIG. 1 wafer fragment at a processing step which is subsequent to that which is shown in FIG. 5.

Referring to FIG. 6, portions of conductive material 64 are removed, as by planarization or other methods, to electrically isolate the conductive material within the openings formed within and laterally adjacent insulative layer 56. Such forms, in one embodiment, a plurality of capacitor storage nodes. Exemplary storage nodes are shown at 66, 68. The storage nodes, as formed, are arranged in columns which are disposed into and out of the plane of the page upon which FIG. 6 appears. Specifically, in this example storage node 66 constitutes one of a plurality of storage nodes arranged in one column which extends into and out of the plane of the page; and, storage node 68 constitutes one of a plurality of storage nodes in a different column which extends into and out of the plane of the page. Each column constitutes an array of storage nodes. The storage nodes can also be formed as containers or cup-like structures, with subsequent processing taking place substantially as described below.

Figure 7:
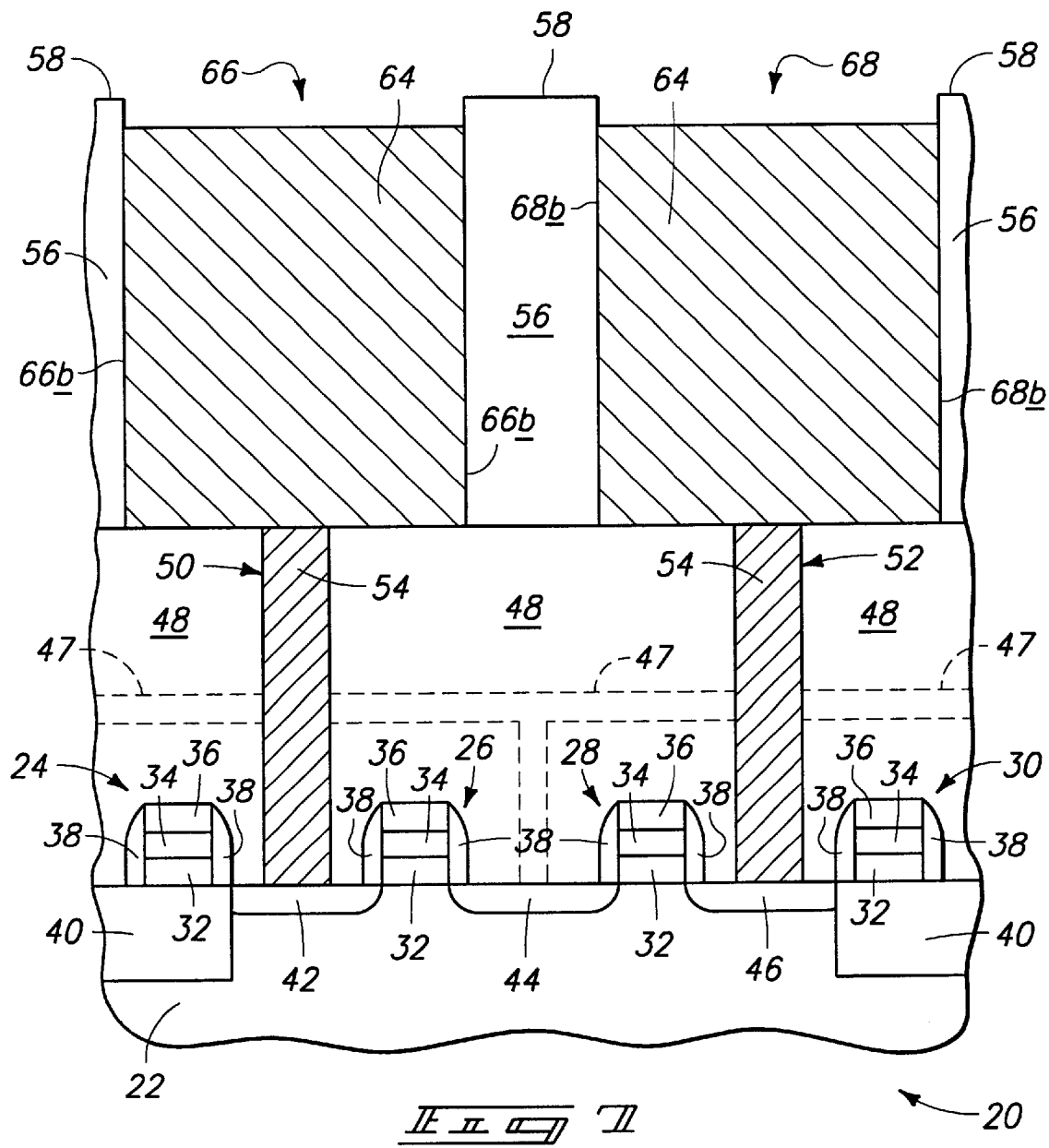
FIG. 7 is a view of the FIG. 1 wafer fragment at a processing step which is subsequent to that which is shown in FIG. 6.

Referring to FIG. 7, portions of conductive material 64 are removed sufficiently to less than fill each opening 66, 68 respectively. Accordingly, such constitutes but one way in which each opening can be less than filled with conductive material. It is possible, as mentioned above, for each opening to be less than filled with conductive material by other techniques. For example, a conformal deposition of conductive material, e.g. polysilicon, can be conducted to less than fill the openings.

In this example, overfilled portions of conductive material 64 are removed to below outer surface 58 of first insulative material layer 56, thereby partially filling each respective opening. Accordingly, each storage node received within layer 56 has an upper surface 66a, 68a respectively, which is disposed elevationally below outer surface 58. The illustrated upper surfaces 66a, 68a constitute uppermost surfaces, and each storage node has a side surface 66b, 68b respectively joined with its associated uppermost surface.

Figure 8:
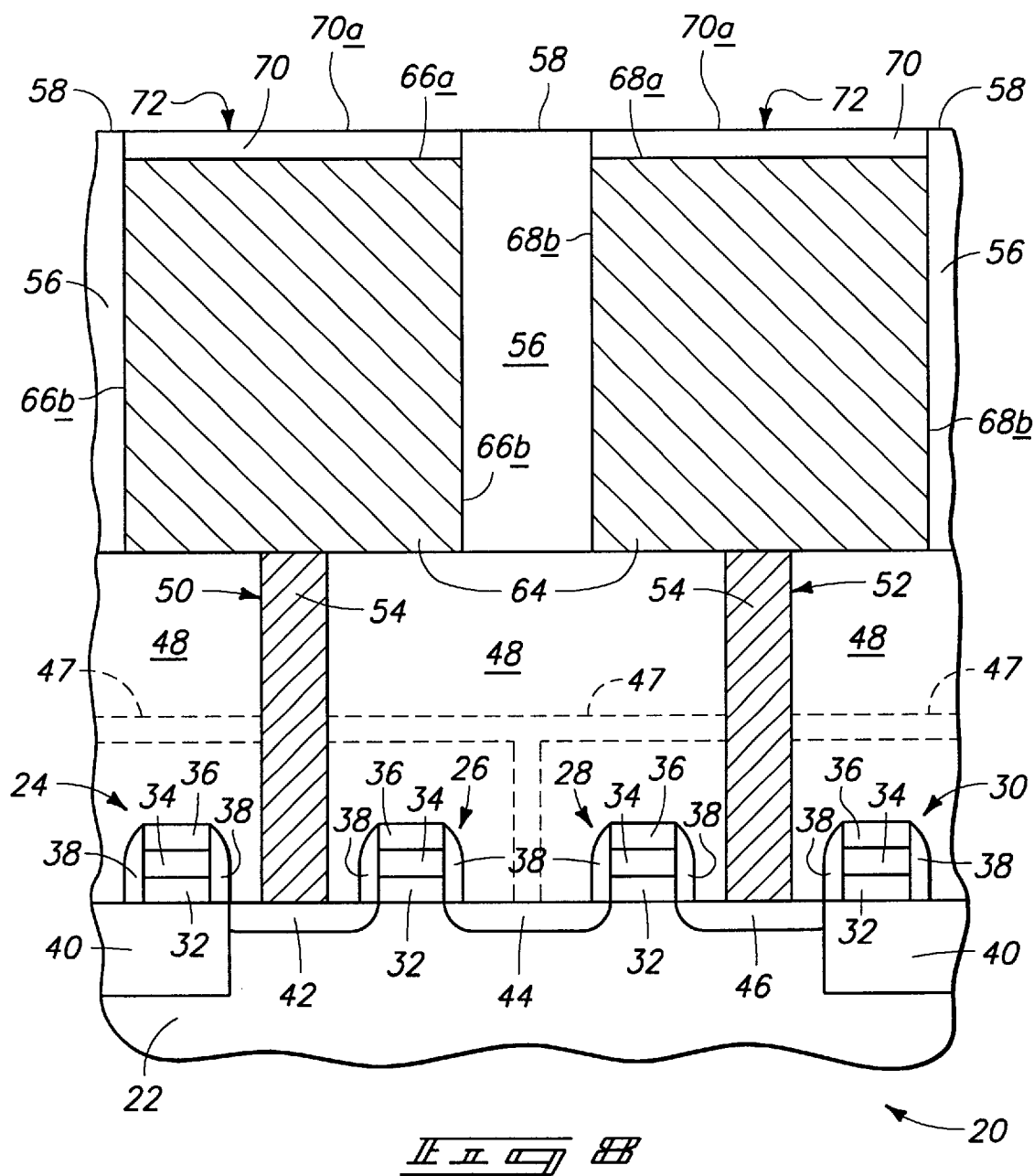
FIG. 8 is a view of the FIG. 1 wafer fragment at a processing step which is subsequent to that which is shown in FIG. 7.

Referring to FIG. 8, an overlying insulative material 70 is formed over the uppermost surfaces 66a, 68b of respective storage nodes 66, 68. In the illustrated example, the formation of insulative material 70 constitutes filling remaining opening portions with insulative material. Insulative material 70 is preferably different from material comprising layer 56 for reasons which will become apparent below. An exemplary material is an oxide formed through decomposition of TEOS. In this example and for purposes of the ongoing discussion, insulative material 70 comprises a second different insulative layer of material, at least a portion of which is disposed within remaining opening portions. Such material can be formed by overfilling the remaining opening portions and planarizing the material relative to outer surface 58 of layer 56. Alternately by way of example only, the layer can be etched back through a timed etch.

In one embodiment, a sufficient amount of insulative material is formed over each storage node such that an insulative material surface 70a is generally coplanar with generally planar outer surface 58.

Alternately considered, protective caps 72 are formed over uppermost surfaces 66a, 68a, with each cap being formed within at least a remaining portion of each opening. The protective caps are insulative in nature and formed over, and in this example, not laterally proximate conductive material comprising each storage node.

Figure 9:
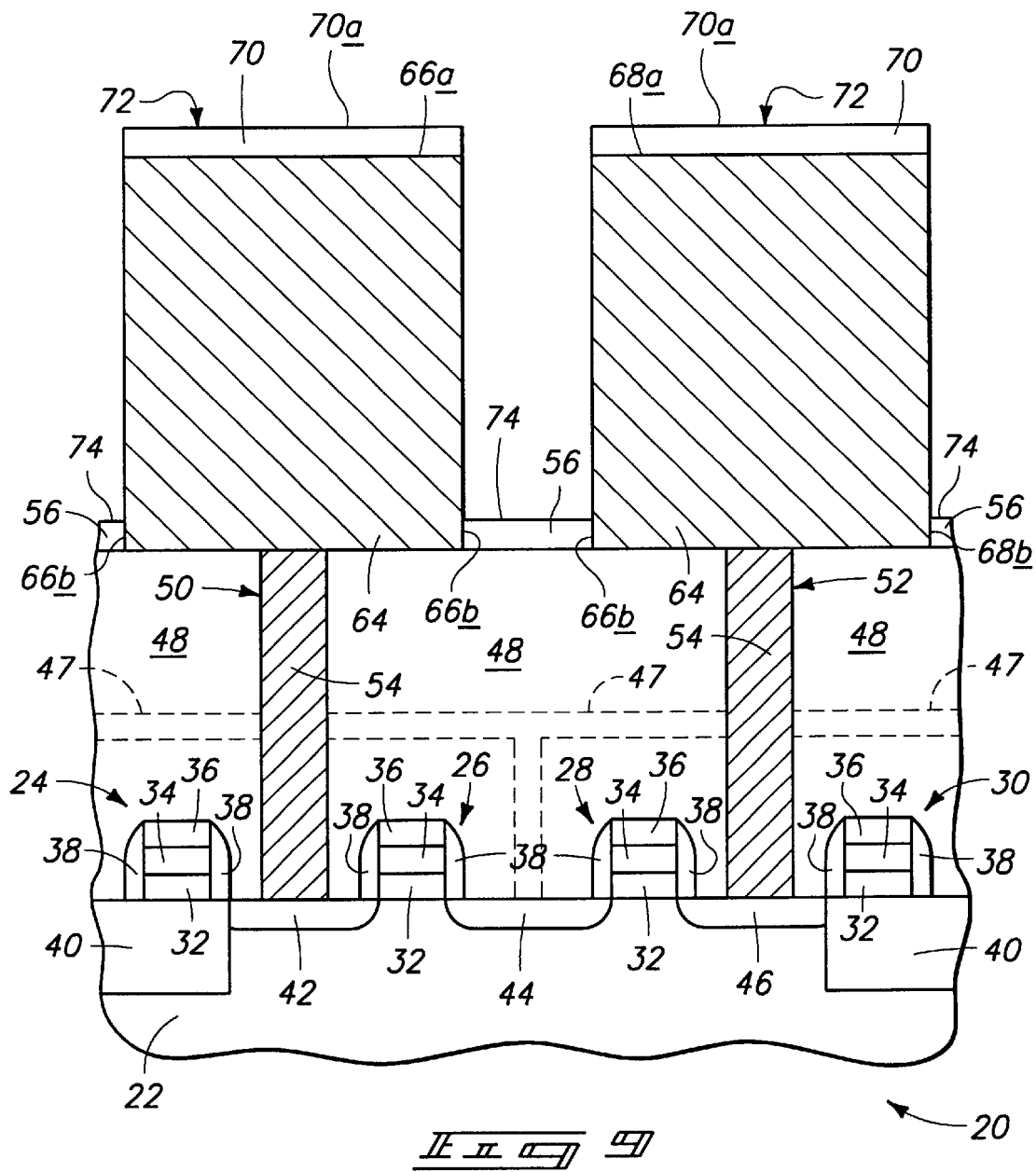
FIG. 9 is a view of the FIG. 1 wafer fragment at a processing step which is subsequent to that which is shown in FIG. 8.

Referring to FIG. 9, portions of first insulative material layer 56 are removed to expose portions of side surfaces 66b, 68b respectively. In one embodiment, material of layer 56 is etched selectively relative to insulative material 70. Such constitutes removing material which is laterally adjacent each storage node sufficiently to expose respective side portions thereof. In this example, storage node portions are partially exposed by the removal of material of layer 56. Accordingly, side surfaces 66b, 68b have respective first portions (undesignated) which are disposed elevationally higher than an adjacent insulative material upper surface 74, and respective second portions (undesignated) which are disposed elevationally lower than the adjacent insulative material upper surface 74. In another embodiment, the removal of material of layer 56 comprises etching such material faster than any of second insulative material 70 sufficiently to expose portions of each capacitor node.

Figure 10:
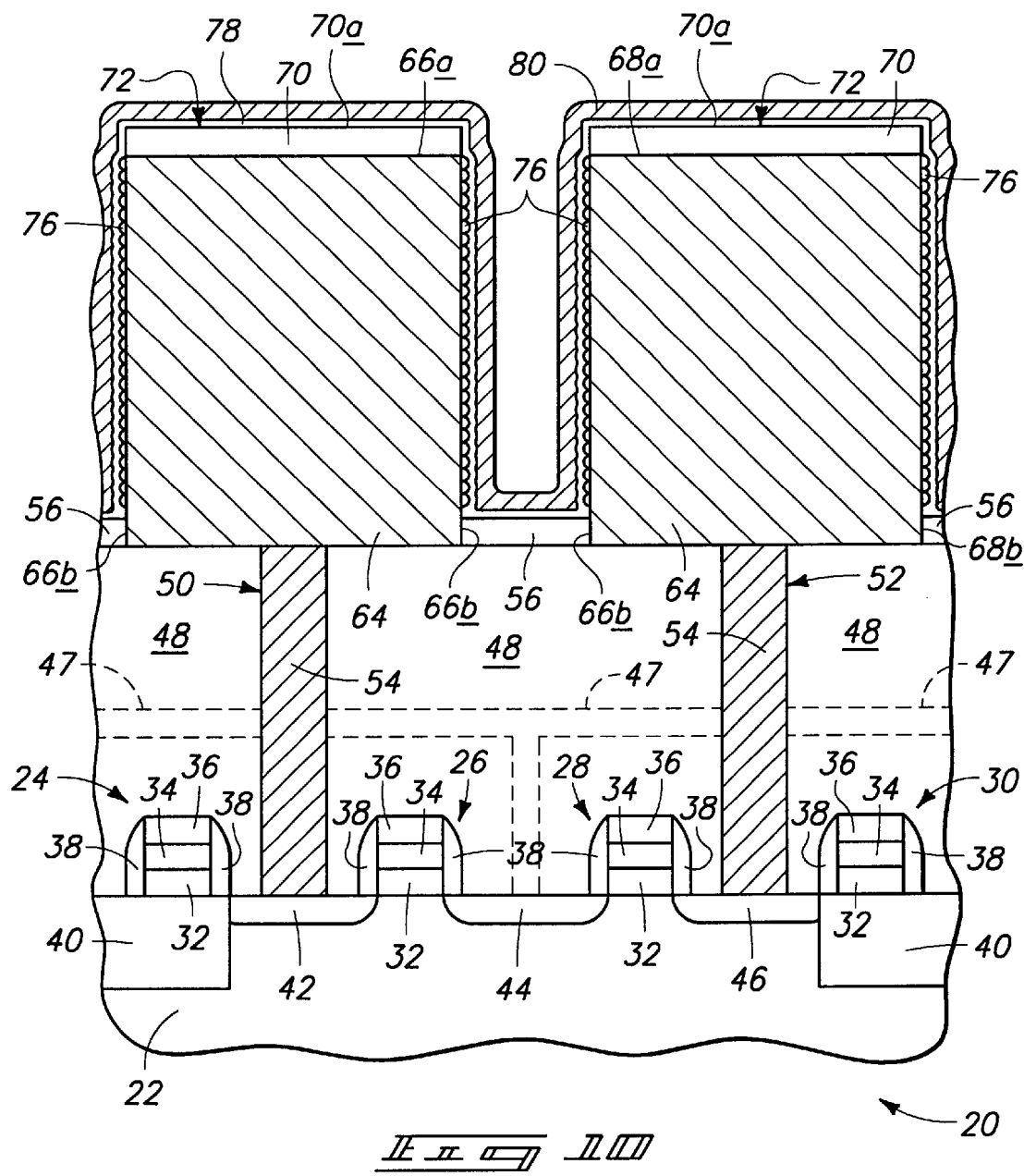
FIG. 10 is a view of the FIG. 1 wafer fragment at a processing step which is subsequent to that which is shown in FIG. 9.

Referring to FIG. 10, a layer of roughened polysilicon 76, e.g. hemispherical grain (HSG) polysilicon or cylindrical grain polysilicon, is formed over exposed portions of each storage node. A capacitor dielectric layer 78 is formed over the exposed side surfaces of each storage node and corresponding portions of each node's protective cap 72. Such forms capacitor dielectric functioning regions which are discrete from the overlying insulative material 70 operably proximate at least a portion of the capacitor storage node.

A common cell electrode layer 80 is formed over capacitor dielectric layer 78, insulative material 70, and the previously-exposed side surfaces of the storage nodes. In this example, layer 80 is formed laterally proximate the respective side surface first portions which were previously exposed. Alternately considered, the array of storage nodes is first electrically interconnected in a capacitor array configuration with common cell electrode layer 80.

Figure 11:
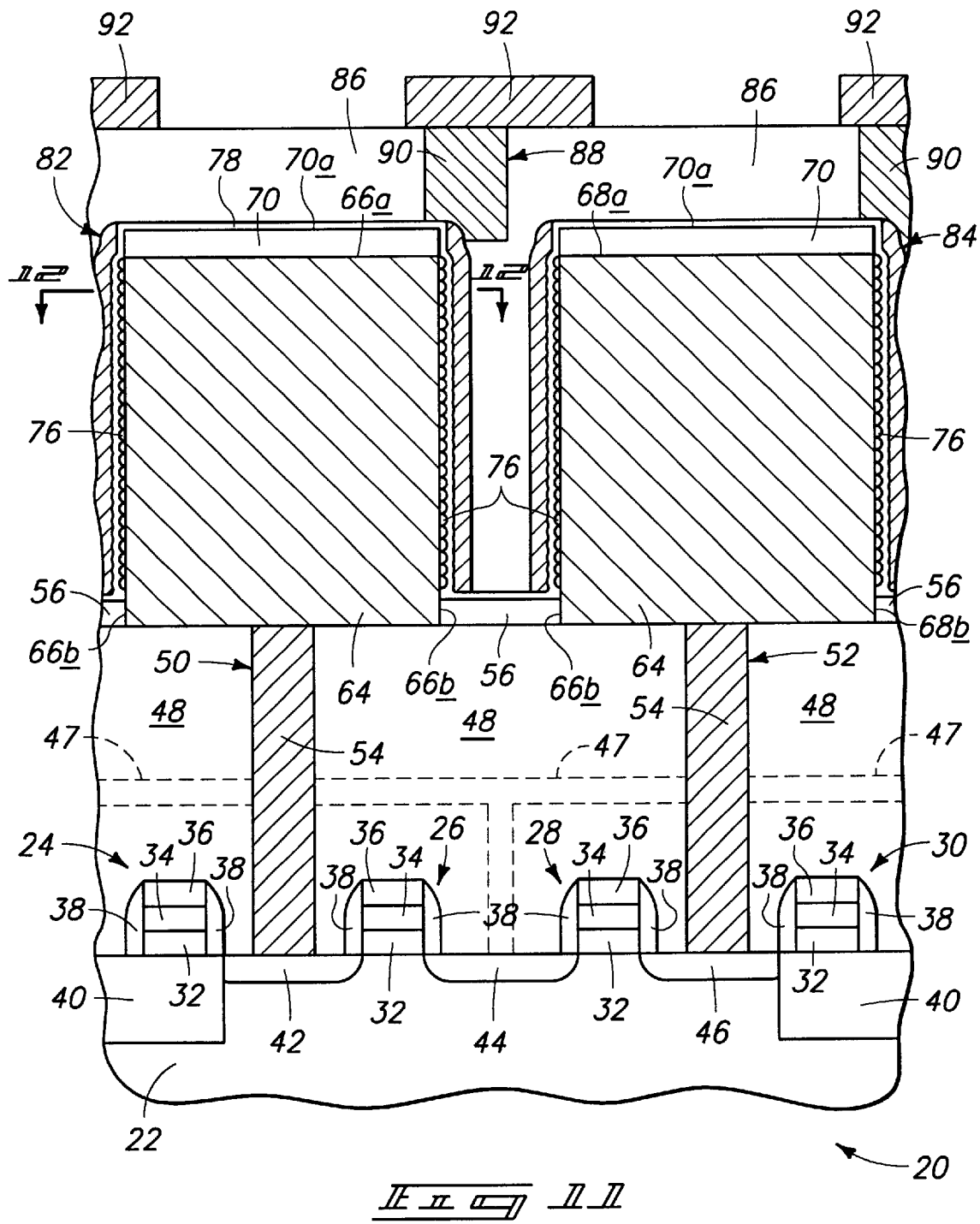
FIG. 11 is a view of the FIG. 1 wafer fragment at a processing step which is subsequent to that which is shown in FIG. 10.

Referring to FIG. 11, a number of processing steps have taken place. First, material of common cell electrode layer 80 has been removed from between the columns defined by each of the respective storage nodes. Common cell electrode layer material is also preferably removed from over the individual protective caps. In one embodiment, cell electrode material is left only over generally vertical surfaces. Such serves to isolate individual cell electrodes over their respective capacitor storage nodes. In one embodiment, the removal of material of the common cell electrode layer 80 comprises anisotropically etching such layer and forming individual bands or rings 82, 84 around the node portions which were previously exposed. Overlying insulative layer 70 provides protection during the removal of the material of cell electrode layer 80 so that the risk of exposure and removal of layer 78 adjacent polysilicon 76 can be greatly reduced if not eliminated. In turn, subsequent risks of shorting between the cell plate and storage node can be greatly reduced if not eliminated. In a preferred embodiment, such bands are also formed over portions of the protective caps as shown. In a preferred embodiment, such is accomplished through a maskless etch. In the context of this document, the term "maskless" will be understood to only mean no masking of the area of the layer being etched for purposes of isolating the layer, without requiring no masking of the layer elsewhere on the substrate. A third insulative material 86 is formed over the substrate including the isolated cell electrodes or bands 82, 84. An exemplary material is BPSG. Such material is formed over remaining cell electrode material. Openings 88 are patterned and etched into layer 86, and preferably expose at least some of the remaining cell electrode material or rings 82, 84. Conductive material 90, e.g. conductively doped polysilicon, is formed within openings 88 and preferably electrically interconnects at least some of the isolated individual cell electrodes. Material 90 can be planarized to have a generally planar upper surface which is coplanar with the upper surface of material 86.

Alternately considered, formation of openings 88 constitutes etching a plurality of trenches into the third insulative material and exposing isolated individual cell electrodes. Subsequently, conductive material 90 is formed over the substrate and fills the trenches. Such constitutes second electrically interconnecting some of the isolated cell electrodes with conductive material. By "second electrically interconnecting" is meant that initially, when the cell electrode layer is blanket deposited over the substrate, the cell electrodes for the individual storage capacitors can be considered as being first electrically interconnected. When the conductive material of the cell electrode layer is removed from between the columns of arranged storage capacitors, such can be considered as electrically disconnecting the cell electrodes for the individual storage capacitors. Hence, when conductive material 90 is formed over the selected, isolated cell electrode material, such can be considered as electrically interconnecting some of the cell electrode material for a second time thereby placing them into electrical communication with one another.

Conductive material 92 is subsequently formed over the substrate and patterned into conductive lines which extend to outside circuitry. Exemplary outside circuitry includes sensing circuitry.

Figure 12:
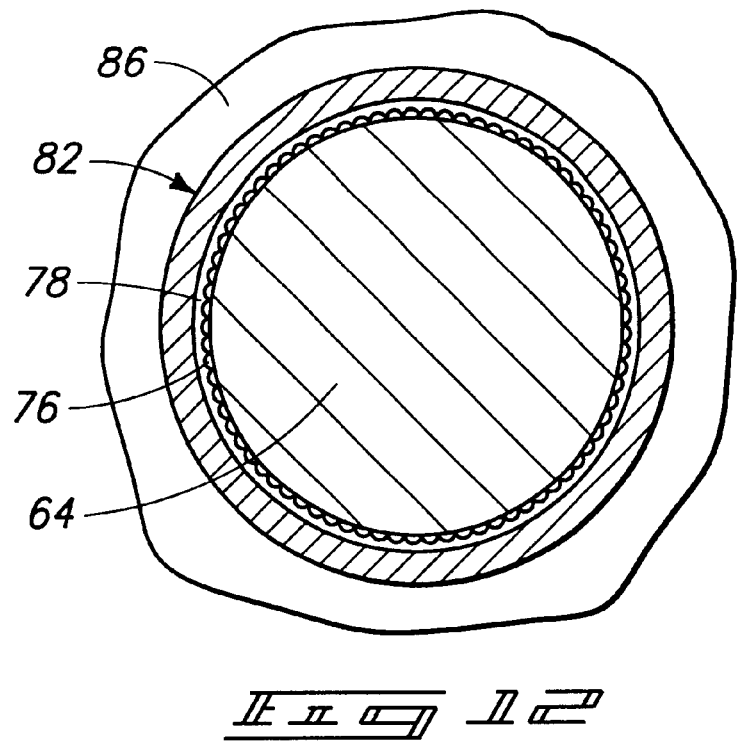
FIG. 12 is a view taken along line 12—12 in FIG. 11.

Referring to FIGS. 11 and 12, integrated circuitry is provided. In one embodiment, a capacitor storage node is provided and includes an uppermost surface 66a and a side surface 66b joined therewith. A protective cap 70 is provided over uppermost surface 66a, and a capacitor dielectric layer 78 is disposed over side surface 66b. A cell electrode band 82 is disposed proximate at least a portion of storage node side surface 66b, and not over storage node uppermost surface 66a. Protective cap 70 has a side surface (not specifically designated), and in one embodiment, cell electrode band 82 is disposed laterally proximate at least a portion of the protective cap side surface. In another embodiment, cell electrode band 82 is disposed over less than an entirety of storage node side surface 66b. In yet another embodiment, cell electrode band 82 has an uppermost portion which extends elevationally higher than any material of capacitor storage node 66.

In another embodiment, integrated circuitry includes a capacitor storage node 66 having an uppermost surface 66a. An insulative material 70 overlies uppermost surface 66a. A capacitor dielectric functioning region which is discrete from overlying insulative material 70 is disposed operably proximate at least a portion of the capacitor storage node. A cell electrode layer 82 is disposed laterally proximate the capacitor dielectric functioning region and overlying insulative material 70. In one embodiment, a substantial portion of the dielectric functioning region is disposed only laterally proximate the capacitor storage node. In another embodiment, the dielectric functioning region comprises a layer of dielectric material 78 which extends over overlying insulative material 70 and defines a non-dielectric functioning region. In another embodiment, the dielectric functioning region defines a band of dielectric material (FIG. 12) which laterally encircles at least a portion of storage node 66. In yet another embodiment, cell electrode layer 82 defines a band of conductive material which laterally encircles at least a portion of storage node 66. In yet another embodiment, cell electrode layer 82 comprises an uppermost band portion which extends elevationally higher than storage node uppermost surface 66a.

In another embodiment, a capacitor-over-bit line memory array is provided and includes a substrate 22 having a pair of spaced-apart conductive lines 26, 28 disposed thereover. A pair of diffusion regions 42, 46 are received within substrate 22 operably proximate conductive lines 26, 28. Conductive material 54 is disposed over and in electrical communication with diffusion regions 26, 28 respectively, and extends away therefrom. A pair of capacitor storage nodes 66, 68 are provided, each of which is operably joined with and in electrical communication with a respective one of the diffusion regions through the conductive material disposed thereover. Each storage node has an uppermost surface 66a, 68a respectively, and a respective side surface 66b, 68b joined therewith. A protective cap 70 is provided over each uppermost surface 66a, 68a, and a capacitor dielectric layer 78 is disposed over each side surface 66b, 68b. Cell electrode bands 82, 84 are respectively disposed proximate at least a portion of each associated storage node side surface 66b, 68b respectively, and not over the associated storage node uppermost surface 66a, 68a. The capacitor-over-bit line circuitry just described can have any of the constructions discussed above.

Figure 13:
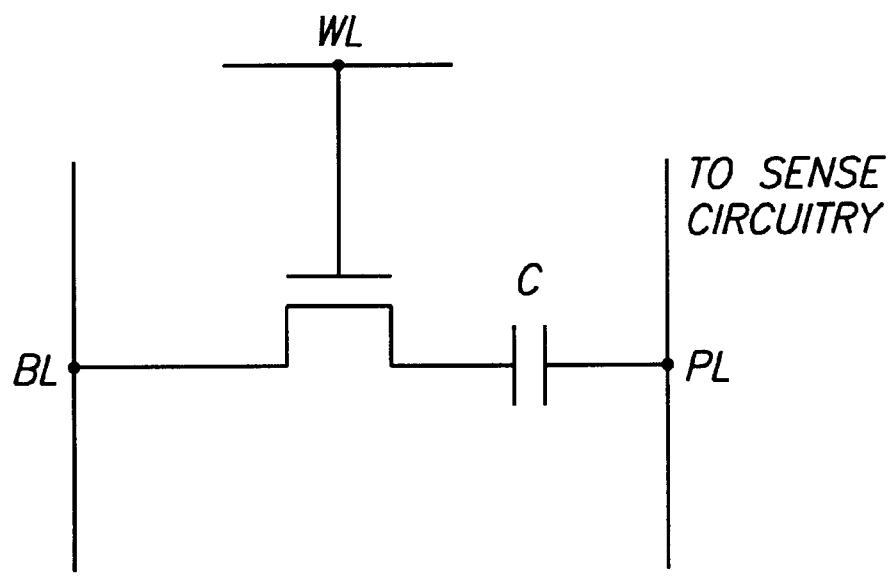
FIG. 13 is a schematic circuit diagram of electronic circuitry formed in accordance with the inventive methodologies.

Referring to FIG. 13, a circuit schematic is shown which depicts a DRAM cell having an access transistor, a bit line BL, a storage capacitor C, and a segmented field plate column line PL. In a preferred embodiment, the segmented field plate column line PL is defined by either or both of conductive materials 90, 92 (FIG. 11). Whereas in the past, the field plate or cell electrode was shared by all of the capacitors in the memory array of a DRAM, the present invention provides methods by which discrete columns of capacitors can be connected into columns which can be selectively used, individually and directly in sensing applications.

Advantages can also be achieved in improving the voltage swing across the capacitors in the memory array and in improving the differential voltage signal as compared with the differential signal produced by an array having a common shared cell plate layer. Other advantages will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:
   forming a layer of material over a substrate, the layer of material having a generally planar outer surface;
   forming a capacitor storage node having an uppermost surface, the storage node to be received within the layer of material and to have an upper surface elevationally below the generally planar outer surface;
   forming an overlying insulative material over the uppermost surface, the forming of the insulative material comprising forming a sufficient amount of the insulative material over the storage node to have an insulative material surface which is generally coplanar with the generally planar outer surface of the layer of material;
   after forming the capacitor storage node and the overlying insulative material, forming a capacitor dielectric functioning region discrete from the overlying insulative material operably proximate at least a portion of the capacitor storage node; and
   forming a cell electrode layer over the capacitor dielectric functioning region and the overlying insulative material.

2. The method of claim 1, wherein the forming of the capacitor storage node comprises:
   forming an opening received within the layer of material; and
   forming a layer of conductive material within the opening to less than fill the opening.

3. The method of claim 1, wherein the forming of the capacitor storage node comprises:
   forming an opening received within the layer of material;
   overfilling the opening with conductive material; and
   removing a sufficient amount of the conductive material to less than fill the opening.

4. The method of claim 1, wherein:
   the forming of the capacitor storage node comprises:
      forming an opening received within the layer of material; and
      forming a layer of conductive material within the opening to less than fill the opening; and
   the forming of the insulative material comprises filling remaining opening portions with the insulative material.

5. The method of claim 1, wherein:
   the forming of the capacitor storage node comprises:
      forming an opening received within the layer of material; and
      forming a layer of conductive material within the opening to less than fill the opening; and
   prior to the forming of the capacitor dielectric function region, etching the layer of material selectively relative to the insulative material and exposing a side surface of the storage node.

6. The method of claim 5 further comprising forming a layer of roughened polysilicon over the exposed side surface of the storage node.

7. The method of claim 1 further comprising after the forming of the cell electrode layer, conducting a maskless etch of the cell electrode layer leaving cell electrode material only over generally vertical surfaces.

8. The method of claim 1, wherein the forming of the capacitor storage node comprises forming said node as a capacitor storage node container.

9. A method of forming a capacitor comprising:
   forming a capacitor storage node having an uppermost surface and a side surface joined therewith;
   forming a protective cap over the uppermost surface;
   forming a capacitor dielectric layer over the side surface and protective cap; and
   forming a cell electrode layer over the side surface of the capacitor storage node, the protective cap and storage node side surface, and removing material of the cell electrode layer from over protective cap.

10. The method of claim 9, wherein the forming of the capacitor storage node comprises:
    forming a layer of material over a substrate;
    forming an opening received within the layer of material; and
    forming conductive material within the opening.

11. The method of claim 9, wherein the forming of the capacitor storage node comprises:
    forming a layer of material over a substrate;
    forming an opening received within the layer of material; and
    filling the opening with conductive material.

12. The method of claim 9, wherein:
    the forming of the capacitor storage node comprises:
       forming a layer of material over a substrate;
       forming an opening received within the layer of material; and
       less than filling the opening with conductive material; and
    the forming of the protective cap comprises forming the cap at least within a remaining opening portion.

13. The method of claim 9, wherein the forming of the capacitor storage node comprises forming conductive material laterally adjacent a layer of material, and further comprising after the forming of the protective cap, removing material of the laterally adjacent layer of material and exposing a side surface portion of the storage node.

14. The method of claim 9, wherein the forming of the capacitor storage node comprises forming conductive material laterally adjacent a layer of material, and further comprising after the forming of the protective cap, selectively etching material of the laterally adjacent layer of material relative to the protective cap and exposing a side surface portion of the storage node.

15. The method of claim 9, wherein removing comprises anisotropically etching the cell electrode layer without a mask.

16. The method of claim 9, wherein the forming of the capacitor storage node comprises forming conductive material laterally adjacent a layer of material, and further comprising after the forming of the protective cap, removing material of the laterally adjacent layer of material and exposing a side surface portion of the storage node.

17. The method of claim 9, wherein the forming of the capacitor storage node comprises forming conductive material laterally adjacent a layer of material, and further comprising after the forming of the protective cap, selectively etching material of the laterally adjacent layer of material relative to the protective cap and exposing a side surface portion of the storage node.

18. The method of claim 9, wherein the forming of the protective cap comprises forming said cap from insulative material.

19. A method of forming a plurality of capacitors comprising:
   forming a plurality of capacitor storage nodes arranged in columns;
   forming a capacitor dielectric layer over at least portions of the capacitor storage nodes;
   forming a common cell electrode layer over the plurality of capacitor storage nodes;
   removing cell electrode layer material from between the columns and isolating individual cell electrodes over individual respective capacitor storage nodes by anisotropically etching the cell electrode layer material; and
   after the removing of the cell electrode layer material, forming conductive material over portions of remaining cell electrode material and placing some of the individual cell electrodes into electrical communication with one another.

20. The method of claim 19, wherein the forming of the capacitor storage nodes comprises:
   forming an insulative layer of material;
   forming openings received within the insulative layer of material; and
   forming conductive material received within the openings.

21. The method of claim 19, wherein the forming of the capacitor storage nodes comprises:
   forming an insulative layer of material;
   forming openings received within the insulative layer of material;
   overfilling the openings with conductive material; and
   removing portions of the conductive material and isolating the capacitor storage nodes within the openings.

22. The method of claim 19, wherein the forming of the capacitor storage nodes comprises:
   forming a first insulative layer of material;
   forming openings received within the first insulative layer of material;
   overfilling the openings with conductive material;
   removing portions of the conductive material to below an outer surface of the first insulative layer of material;
   forming a second different insulative layer of material at least within remaining opening portions; and
   removing material of the first insulative layer of material selectively relative to material of the second insulative layer of material and exposing a side surface of the conductive material.

23. The method of claim 19, wherein the forming of the conductive material over the remaining cell electrode material portions comprises:
   forming an insulative layer of material over the remaining cell electrode material;
   exposing at least some of the remaining cell electrode material portions through the insulative layer; and
   forming the conductive material over the remaining cell electrode material portions.

24. The method of claim 19, wherein the forming of the conductive material over the remaining cell electrode material portions comprises;
   forming an insulative layer of material over the remaining cell electrode material;
   etching a trench into the insulative layer and exposing at least some of the remaining cell electrode material portions; and
   forming the conductive material within the trench.

25. The method of claim 19, wherein the forming of the conductive material over the remaining cell electrode material portions comprises:
   forming an insulative layer of material over the remaining cell electrode material;
   etching a trench into the insulative layer and exposing at least some of the remaining cell electrode material portions;
   forming the conductive material within the trench; and
   planarizing the conductive material within the trench relative to an insulative layer outer surface.

26. The method of claim 19, wherein:
   the forming of the capacitor storage nodes comprises:
      forming a first insulative layer of material;
      forming openings received within the first insulative layer of material;
      overfilling the openings with conductive material;
      removing portions of the conductive material to below an outer surface of the first insulative layer of material;
      forming a second different insulative layer of material at least within remaining opening portions; and
      removing material of the first insulative layer of material selectively relative to material of the second insulative layer of material and exposing a side surface of the conductive material.

27. The method of claim 19, wherein:
   the forming of the capacitor storage nodes comprises:
      forming a first insulative layer of material;
      forming openings received within the first insulative layer of material;
      overfilling the openings with conductive material;
      removing portions of the conductive material to below an outer surface of the first insulative layer of material;
      forming a second different insulative layer of material at least within remaining opening portions; and
      removing material of the first insulative layer of material selectively relative to material of the second insulative layer of material and exposing a side surface of the conductive material; and
   the forming of the conductive material over the remaining cell electrode material portions comprises:
      forming a third insulative layer of material over the remaining cell electrode material;
      exposing at least some of the remaining cell electrode material portions through the third insulative layer; and
      forming the conductive material over the remaining cell electrode material portions.

28. The method of claim 19, wherein:
   the forming of the capacitor storage nodes comprises:
      forming a first insulative layer of material;
      forming openings received within the first insulative layer of material;

overfilling the openings with conductive material;
removing portions of the conductive material to below an outer surface of the first insulative layer of material;
forming a second different insulative layer of material at least within remaining opening portions; and
removing material of the first insulative layer of material selectively relative to material of the second insulative layer of material and exposing a side surface of the conductive material; and the forming of the conductive material over the remaining cell electrode material portions comprises:
forming a third insulative layer of material over the remaining cell electrode material;
etching a trench into the third insulative layer and exposing at least some of the remaining cell electrode material portions; and
forming the conductive material within the trench.

29. A method of forming a plurality of capacitors comprising:
forming a plurality of capacitor storage nodes having respective capacitor dielectric layers disposed thereover, the capacitor storage nodes being arranged in columns;
forming a common cell electrode layer over the plurality of capacitor storage nodes;
without masking, etching the common cell electrode layer to electrically isolate individual cell electrodes over individual respective capacitor storage nodes; and
electrically interconnecting selected electrically isolated individual cell electrodes.

30. The method of claim 29, wherein:
the forming of the capacitor storage nodes comprises forming respective storage node upper surfaces and side surfaces joined therewith, the respective side surfaces having first portions which are disposed elevationally higher than an adjacent insulative material upper surface, and second portions which are disposed elevationally lower than the adjacent insulative material upper surface; and
the forming of the common cell electrode layer comprises forming the layer laterally proximate the respective side surface first portions.

31. The method of claim 29 further comprising prior to the forming of the common cell electrode layer, forming individual insulative material caps over the capacitor storage nodes.

32. The method of claim 29, wherein:
the forming of the capacitor storage nodes comprises forming respective storage node upper surfaces and side surfaces joined therewith, the respective side surfaces having first portions which are disposed elevationally higher than an adjacent insulative material upper surface, and second portions which are disposed elevationally lower than the adjacent insulative material upper surface; and
after the forming of the capacitor storage nodes, forming individual insulative material caps over the capacitor storage nodes' upper surfaces, and wherein the forming of the common cell electrode layer comprises forming the layer laterally proximate the respective side surface first portions.

33. The method of claim 29, wherein:
the forming of the plurality of capacitor storage nodes comprises:

forming an insulative layer;
forming individual storage nodes received within the insulative layer; and
removing material of the insulative layer and partially exposing respective storage node portions; and
the etching of the common cell electrode layer comprises forming individual cell electrode bands around the node portions which were previously exposed.

34. The method of claim 29, wherein:
the forming of the plurality of capacitor storage nodes comprises:
forming an insulative layer;
forming individual storage nodes received within the insulative layer;
forming protective caps over the capacitor storage nodes; and
selectively removing material of the insulative layer relative to the protective caps and partially exposing respective storage node portions; and
the etching of the common cell electrode layer comprises forming individual cell electrode bands around the node portions which were previously exposed and portions of the protective caps.

35. A method of forming capacitor-over-bit line memory circuitry comprising:
forming a plurality of openings in a first insulative material;
less than filling the openings with a conductive material comprising capacitor storage nodes;
filling the remaining openings with a second insulative material;
etching the first insulative material faster than any of the second insulative material sufficient to expose portions of individual capacitor storage nodes;
forming a capacitor dielectric layer and a common cell electrode layer operably proximate portions of the conductive capacitor storage nodes which were previously exposed;
anisotropically etching the common cell electrode layer and isolating individual cell electrodes over individual respective capacitor storage nodes; and
electrically interconnecting some of the isolated individual cell electrodes with conductive material.

36. The method of claim 35, wherein the less than filling of the openings comprises overfilling the openings with the conductive material and removing overfilled portions of the conductive material.

37. The method of claim 35, wherein the etching of the common cell electrode layer comprises forming respective bands around the individual storage node portions which were previously exposed.

38. The method of claim 35, wherein the interconnecting of the isolated cell electrodes comprises:
forming a third insulative material over the isolated cell electrodes;
etching a trench into the third insulative material and exposing the isolated individual cell electrodes; and
filling the trench with conductive material.

39. The method of claim 35, wherein:
the etching of the common cell electrode layer comprises forming respective bands around the individual storage node portions which were previously exposed; and
the interconnecting of the isolated cell electrodes comprises:

forming a third insulative material over the isolated cell electrodes;

etching a trench into the third insulative material and exposing some of the band portions of the individual storage node portions; and filling the trench with conductive material.

40. A method of forming capacitor-over-bit line memory circuitry comprising:

forming an array of storage nodes arranged into columns;

first electrically interconnecting the array of storage nodes in a capacitor array configuration with a common cell electrode layer;

conducting a maskless etch within the array of the cell electrode layer to remove selected portions thereof sufficient to isolate cell electrodes over individual respective storage nodes; and second electrically interconnecting some of the isolated cell electrodes with conductive material.

41. The method of claim 40, wherein the first electrically interconnecting of the array of storage nodes comprises forming the common cell electrode layer over and laterally proximate the storage nodes.

42. The method of claim 40, wherein the conducting of the maskless etch comprises anisotropically etching the cell electrode layer.

43. The method of claim 40, wherein the conducting of the maskless etch comprises forming a band of cell electrode layer material around portions of the respective storage nodes.

44. The method of claim 40, wherein the forming of the array of storage nodes comprises forming insulative caps over and not laterally proximate conductive material comprising the storage nodes.

45. The method of claim 40, wherein:

the forming of the array of storage nodes comprises forming insulative caps over and not laterally proximate conductive material comprising the storage nodes; and the conducting of the maskless etch comprises forming a band of cell electrode layer material around portions of the respective storage nodes and portions of their associated insulative caps.

* * * * *

UNITED STATES PATENT AND TRADEMARK OFFICE
CERTIFICATE OF CORRECTION

PATENT NO. : 6,312,988 B1
DATED : November 6, 2001
INVENTOR(S) : Tyler A. Lowrey et al.

Page 1 of 1

It is certified that error appears in the above-identified patent and that said Letters Patent is hereby corrected as shown below:

<u>Title page,</u>
Item [57], ABSTRACT,
Line 14, replace "over the uppe-most surface"
With -- over the uppermost surface --.

Signed and Sealed this

Seventh Day of May 2002

*Attest:*

*Attesting Officer*

JAMES E. ROGAN
*Director of the United States Patent and Trademark Office*